United States Patent
Chiou

(10) Patent No.: US 6,503,837 B2
(45) Date of Patent: Jan. 7, 2003

(54) METHOD OF RINSING RESIDUAL ETCHING REACTANTS/PRODUCTS ON A SEMICONDUCTOR WAFER

(75) Inventor: Jiann-Jen Chiou, Hsin-Ying (TW)

(73) Assignee: Macronix International Co. Ltd., Hsin-Chu (TW)

( * ) Notice: Subject to any disclaimer, the term of this patent is extended or adjusted under 35 U.S.C. 154(b) by 106 days.

(21) Appl. No.: 09/820,314

(22) Filed: Mar. 29, 2001

(65) Prior Publication Data

US 2002/0142595 A1 Oct. 3, 2002

(51) Int. Cl.[7] .................................................. B08B 3/02
(52) U.S. Cl. ....................... 438/691; 438/689; 438/745; 134/1.1; 134/1.2; 134/1.3; 134/2; 510/175
(58) Field of Search ................................. 438/389, 745, 438/690, 691; 134/2, 1.1, 1.2, 1.3; 510/175

(56) References Cited

U.S. PATENT DOCUMENTS 5,666,985 A * 9/1997 Smith, Jr. et al.
6,145,519 A * 11/2000 Konishi et al.
6,146,468 A * 11/2000 Dryer et al.

\* cited by examiner

*Primary Examiner*—Gregory E. Webb
(74) *Attorney, Agent, or Firm*—Winston Hsu

(57) ABSTRACT

An etching machine comprises a cleaning solution sprayer, further comprising at least a first nozzle positioned above a center of the wafer and a second nozzle positioned above an edge of the wafer. The semiconductor wafer is spun and simultaneously a cleaning solution is sprayed on the center and the edge of the wafer via the first nozzle and the second nozzle, respectively, to evenly rinse the residual etching solution on the surface of the wafer. The semiconductor wafer is spun dry with a nitrogen purge on the wafer surface at the end of the method.

7 Claims, 2 Drawing Sheets

METHOD OF RINSING RESIDUAL ETCHING REACTANTS/PRODUCTS ON A SEMICONDUCTOR WAFER

BACKGROUND OF THE INVENTION

1. Field of the Invention

The present invention relates to a method of drying a semiconductor wafer, and more specifically, to a method of drying the semiconductor wafer so as to rinse residual etching reactants/product from the surface of the semiconductor wafer.

2. Description of the Prior Art

In semiconductor processing, lithography and etching are two commonly used processes. During lithography, light is projected from above through a photo mask onto a photoresist layer coated on a semiconductor wafer. The photoresist layer on the wafer is then exposed and developed thus creating a pattern corresponding to that of the photo mask. During etching, materials such as silicon or $SiO_2$ in areas on the semiconductor wafer not covered by the photoresist layer are etched followed by removal of remaining photoresist. Therefore, developing effective and accurate methods to transfer the pattern of the photo mask onto the semiconductor wafer through use of lithography and etching continues to be a top priority.

Please refer to FIG. 1 of a schematic view of rinsing residual etching reactants/product on the surface of a semiconductor wafer 10 according to the prior art. As shown in FIG. 1, a semiconductor wafer 10 is positioned on an etching machine 12 comprising a cleaning solution sprayer 14 above a center of the semiconductor wafer 10.

The semiconductor wafer 10 is spun at the beginning of the rinsing method according to the prior art. Simultaneously, a cleaning solution 16, primarily composed of deionized water (DI water), is sprayed on the center of the surface of the semiconductor wafer 10 via the cleaning solution sprayer 14. Therefore, the residual etching reactants/product on the surface of the semiconductor wafer 10 is rinsed. Finally, the semiconductor wafer 10 is spun dry with a nitrogen purge on the surface of the semiconductor wafer 10 (not shown), at the end of the rinsing method according to the prior art.

However, the method of rinsing residual etching reactants/product on the surface of the semiconductor wafer 10 according to the prior art is to spray the cleaning solution 16 on the center of the semiconductor wafer 10 merely via the cleaning solution sprayer 14. By performing a spinning-dry process with a nitrogen purge on the center of the semiconductor wafer 10, the residual etching reactants/product on the surface of the semiconductor wafer 10 is rinsed by portions of the cleaning solution 16 sprayed on the center of the semiconductor wafer 10. Both portions of the cleaning solution 16 and most of the residual etching reactants/product are then removed from the semiconductor wafer 10 by centrifugal force caused by the spinning-dry process. Therefore, light amount of the etching solution normally resides and over-etches the edge of the semiconductor 10 so as to cause defects that affect the quality of the semiconductor wafer 10. This then can lead to reduced yield rates in subsequent processes and reduce the quality of the product.

SUMMARY OF THE INVENTION

It is therefore a primary objective of the present invention to provide a method of cleaning the surface of a semiconductor wafer so as to rinse residual etching reactants/product from the surface of the semiconductor wafer.

In the preferred embodiment of the present invention, a semiconductor wafer is positioned on an etching machine comprising a cleaning solution sprayer. The cleaning solution sprayer comprises at least a first nozzle positioned above a center of the wafer center, and a second nozzle positioned above an edge of the wafer. At the beginning of the method provided in the present invention, the semiconductor wafer is spun. Simultaneously a cleaning solution is sprayed on the center and the edge of the wafer via the first nozzle and the second nozzle, respectively, to evenly rinse the residual etching reactants/product from the surface of the semiconductor wafer. Finally, a spin-drying process is performed on the semiconductor wafer with a nitrogen purge on the wafer surface at the end of the method. The preferred period of the nitrogen purge ranges from 30 to 50 seconds.

It is an advantage of the present invention against the prior art that the cleaning solution sprayer comprises a first nozzle and a second nozzle, so that the cleaning solution is sprayed on the center and the edge of the semiconductor wafer via the first nozzle and the second nozzle, respectively. This means that the residual etching reactants/product on the surface of the semiconductor wafer is evenly and thoroughly rinsed so that an over-etch on the edge of the semiconductor wafer caused by residual etching reactants/product is prevented. As a result, the quality of the semiconductor wafer and the yield rates of subsequent processes are significantly improved.

These and other objectives of the present invention will no doubt become obvious to those of ordinary skill in the art after reading the following detailed description of the preferred embodiment, which is illustrated in the multiple figures and drawings.

DETAILED DESCRIPTION OF THE PREFERRED EMBODIMENT

Figure 1:
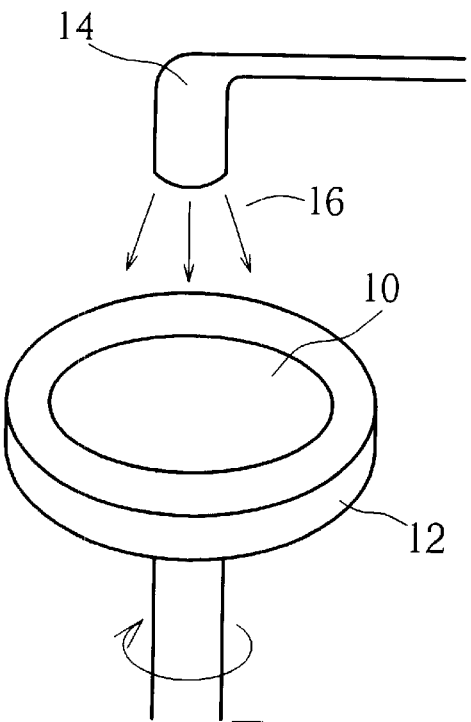
FIG. 1 is a schematic view of rinsing residual etching reactants/product on the surface of a semiconductor wafer 10 according to the prior art.
Figure 2:
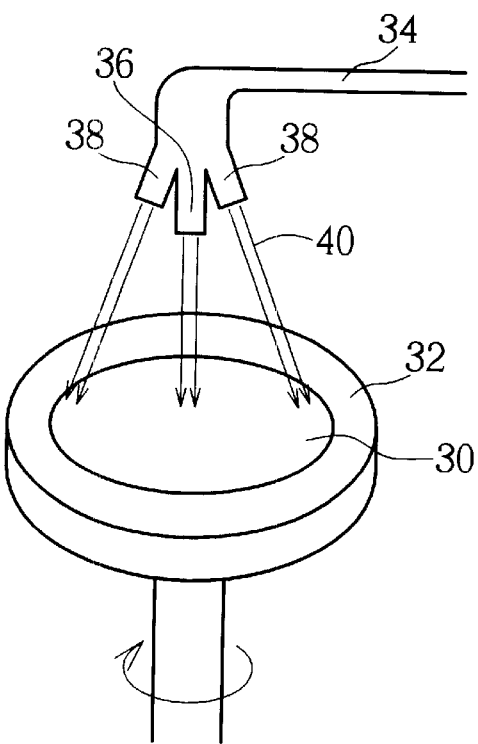
FIG. 2 is a schematic view of rinsing residual etching reactants/product on a semiconductor wafer according to the present invention.
Figure 3:
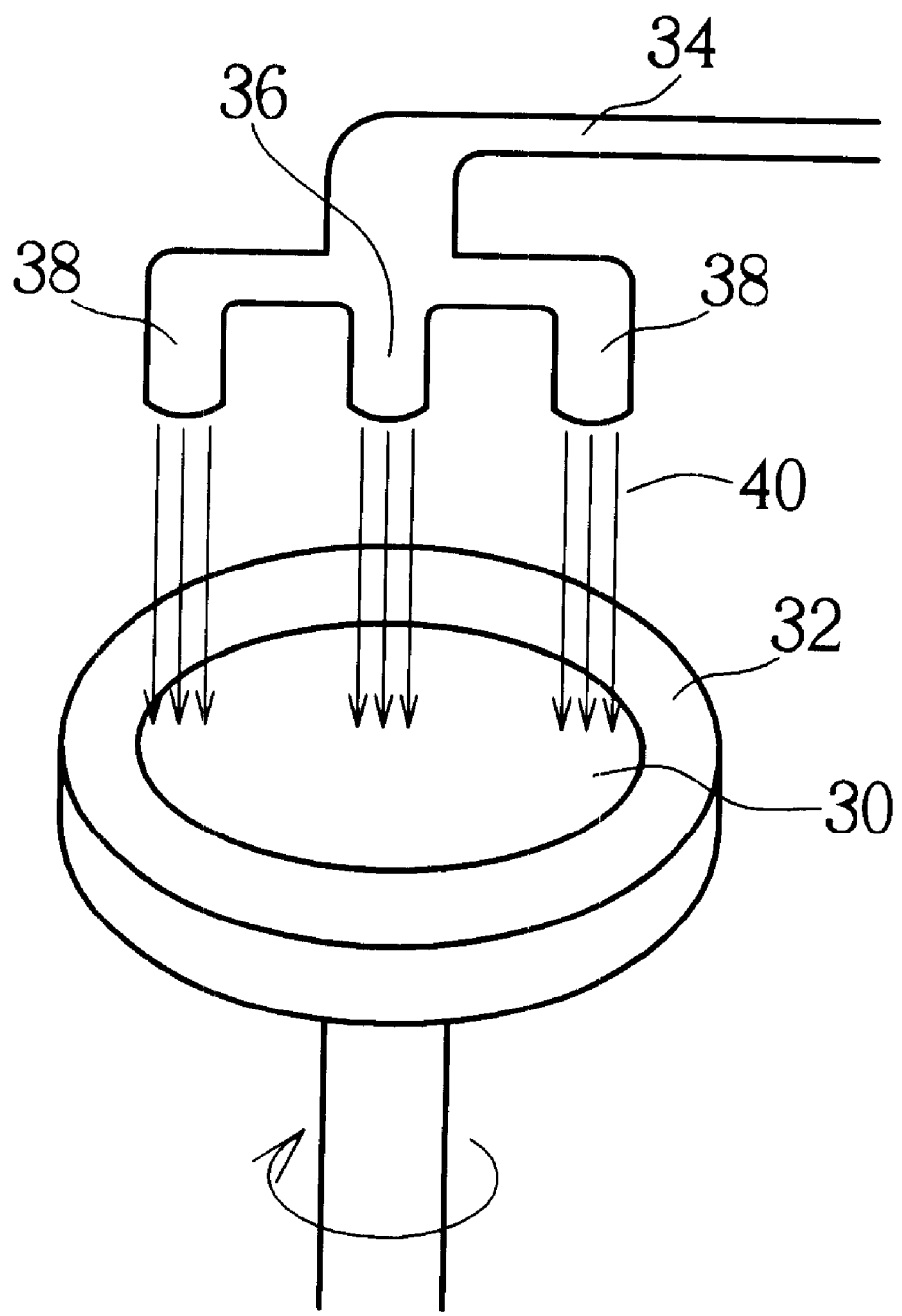
FIG. 3 is a schematic view of an alternative embodiment of the present invention.

Please refer to FIG. 2 and FIG. 3. FIG. 2 is a schematic view of the method of rinsing residual etching reactants/product from a semiconductor wafer 30 according to the present invention. FIG. 3 is a schematic view of an alternative embodiment of the present invention. As shown in FIG. 2 and FIG. 3, the semiconductor wafer 30 is positioned on an etching machine 32. The etching machine 32 comprises a cleaning solution sprayer 34, further comprising at least a first nozzle 36 positioned above a center of the semiconductor wafer 30, and one or multiple second nozzles 38 positioned above an edge of the semiconductor wafer 30 to surround the first nozzle 36. Usually the etching machine 32 is a high-density plasma (HDP) etching machine.

The method of the present invention begins with spinning the semiconductor wafer 30. Simultaneously, a cleaning solution 40, comprising of deionized water (DI water) or other chemical solutions, is sprayed on the center and the edge of the semiconductor wafer 30 via the first nozzle 36 and the second nozzle 38 using different spraying angles. The residual etching solution on the surface of the semiconductor wafer 30 is thus evenly rinsed. In another embodiment of the present invention, the cleaning solution 40 is sprayed on the center and the edge of the semiconductor wafer 30 via the first nozzle 36 and the second nozzle 38 in a parallel manner with an identical spraying angle, as shown in FIG. 3.

In comparison with the arrangement of the first nozzle 36 and the second nozzle 38 shown in FIG. 2 and FIG. 3, the first nozzle 36 and the second nozzle 38 can also be connected to different pipes, supplying different cleaning solutions or gases, respectively. Besides, more than one second nozzle 38 can be allocated to one first nozzle 36. Finally, a spin-drying process is performed on the semiconductor wafer 30 with a nitrogen purge on the surface of the semiconductor wafer 30 at the end of the method. The preferred period of the nitrogen purge is ranges from 30 to 50 seconds.

In comparison with the prior art, the present invention provides a cleaning solution sprayer comprising a first nozzle and a second nozzle. The cleaning solution can be simultaneously sprayed on the center and the edge of the semiconductor wafer via the first nozzle and the second nozzle, respectively, in either a dispersing manner with different spraying angles or a parallel manner with effectively identical spraying angles. The residual etching solution on the surface of the semiconductor wafer is thus rinsed evenly and thoroughly so as to prevent an over-etch on the edge of the semiconductor wafer caused by the residual etching reactants/product. Therefore, both the surface quality of the semiconductor wafer and yield rates of subsequent processes are significantly improved.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method of rinsing residual etching reactants/product on a semiconductor wafer positioned on an etching machine, the etching machine comprising a cleaning solution sprayer, the cleaning solution sprayer comprising at least a first nozzle positioned above a center of the wafer center, and a second nozzle positioned above an edge of the wafer, the method comprising:

spinning the semiconductor wafer and simultaneously spraying a cleaning solution on the center and the edge of the wafer via the first nozzle and the second nozzle, respectively, to evenly rinse the residual etching solution on the surface of the semiconductor wafer; and spin-drying the semiconductor wafer.

2. The method of claim 1 wherein the etching machine is a high-density plasma (HDP) etching machine.

3. The method of claim 1 wherein the cleaning solution is composed of deionized water (DI water).

4. The method of claim 1 wherein the surface of the semiconductor wafer is spun dry with a nitrogen purge.

5. The method of claim 1 wherein the cleaning solution sprayer comprises a plurality second nozzles positioned above the edge of the semiconductor wafer and surrounding the first nozzle.

6. The method of claim 1 wherein the first nozzle and the second nozzle have effectively identical spraying angles to spray the cleaning solution in a parallel manner.

7. The method of claim 1 wherein the first nozzle and the second nozzle have different spraying angles to spray the cleaning solution in a dispersing manner.

* * * * *